(12) United States Patent
Razouk et al.

(10) Patent No.: US 8,686,332 B2
(45) Date of Patent: Apr. 1, 2014

(54) OPTICALLY-CONTROLLED SHUNT CIRCUIT FOR MAXIMIZING PHOTOVOLTAIC PANEL EFFICIENCY

(75) Inventors: Reda R. Razouk, Sunnyvale, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 291 days.

(21) Appl. No.: 13/042,173

(22) Filed: Mar. 7, 2011

(65) Prior Publication Data

US 2012/0228480 A1  Sep. 13, 2012

(51) Int. Cl.
*G01C 21/02* (2006.01)
*H01L 31/042* (2006.01)

(52) U.S. Cl.
USPC ........................................ 250/203.4; 136/244

(58) Field of Classification Search
USPC ........................................ 250/203.4; 136/244
See application file for complete search history.

(56) References Cited

U.S. PATENT DOCUMENTS

| | | |
|---|---|---|
| 4,129,788 A | 12/1978 | Chavannes |
| 4,688,538 A | 8/1987 | Ward et al. |
| 4,725,740 A | 2/1988 | Nakata |
| 5,204,586 A * | 4/1993 | Moore ........................ 315/159 |
| 5,408,404 A | 4/1995 | Mitchell |
| 5,747,967 A | 5/1998 | Muljadi et al. |
| 5,751,120 A | 5/1998 | Zeitler et al. |
| 5,892,354 A | 4/1999 | Nagao et al. |
| 6,169,678 B1 | 1/2001 | Kondo et al. |
| 6,281,485 B1 | 8/2001 | Siri |
| 6,331,670 B2 | 12/2001 | Takehara et al. |
| 6,608,404 B2 | 8/2003 | Schienbein et al. |
| 6,633,823 B2 | 10/2003 | Bartone et al. |
| 6,750,391 B2 | 6/2004 | Bower et al. |
| 6,844,739 B2 | 1/2005 | Kasai et al. |
| 6,850,820 B2 | 2/2005 | Tajima |
| 6,858,791 B2 * | 2/2005 | Erban ........................... 136/244 |

(Continued)

FOREIGN PATENT DOCUMENTS

| | | |
|---|---|---|
| EP | 1 239 573 A1 | 9/2002 |
| ES | 2 249 147 B1 | 5/2007 |

(Continued)

OTHER PUBLICATIONS

"PV FAQs", U.S. Department on Energy, Jan. 2004, 2 pages.

(Continued)

*Primary Examiner* — Thanh Luu
(74) *Attorney, Agent, or Firm* — Andrew Viger; Wade J. Brady, III; Frederick J. Telecky, Jr.

(57) ABSTRACT

An optically-controlled shunt (OCS) circuit includes a switch and a light sampler. The light sampler is coupled to the switch and is configured to sample light at a photovoltaic (PV) cell corresponding to the OCS circuit and to turn on the switch when the sampled light comprises insufficient light for the PV cell. The light sampler may also be configured to turn off the switch when the sampled light comprises sufficient light for the PV cell. The light sampler may further be configured to partially turn on the switch when the sampled light comprises adequate light for the PV cell and to turn off the switch when the sampled light comprises full light for the PV cell. The switch could include a transistor, and the light sampler could include a photodiode.

12 Claims, 4 Drawing Sheets

(56) References Cited

U.S. PATENT DOCUMENTS

| | | | |
|---|---|---|---|
| 6,966,184 | B2 | 11/2005 | Toyomura et al. |
| 6,975,522 | B2 | 12/2005 | Asano |
| 6,984,967 | B2 | 1/2006 | Notman |
| 7,046,527 | B2 | 5/2006 | West |
| 7,701,083 | B2 | 4/2010 | Savage |
| 7,723,865 | B2 | 5/2010 | Kitanaka |
| 2004/0135545 | A1 | 7/2004 | Fowler et al. |
| 2005/0051727 | A1* | 3/2005 | Jones et al. ............... 250/339.02 |
| 2005/0105224 | A1 | 5/2005 | Nishi |
| 2006/0017327 | A1 | 1/2006 | Siri et al. |
| 2006/0149607 | A1 | 7/2006 | Sayers et al. |
| 2006/0171182 | A1 | 8/2006 | Siri et al. |
| 2007/0137688 | A1 | 6/2007 | Yoshida |
| 2007/0164612 | A1 | 7/2007 | Wendt et al. |
| 2008/0013347 | A1 | 1/2008 | Deng et al. |
| 2008/0087321 | A1 | 4/2008 | Schwartzman |
| 2008/0097655 | A1 | 4/2008 | Hadar et al. |
| 2008/0143188 | A1 | 6/2008 | Adest et al. |
| 2008/0150366 | A1 | 6/2008 | Adest et al. |
| 2009/0039852 | A1 | 2/2009 | Fishelov et al. |
| 2009/0140719 | A1 | 6/2009 | Hasenfus |
| 2009/0242011 | A1 | 10/2009 | Proisy et al. |
| 2009/0283128 | A1 | 11/2009 | Zhang et al. |
| 2009/0283129 | A1 | 11/2009 | Foss |
| 2009/0284078 | A1 | 11/2009 | Zhang et al. |
| 2009/0284232 | A1 | 11/2009 | Zhang et al. |
| 2009/0284240 | A1 | 11/2009 | Zhang et al. |
| 2009/0284998 | A1 | 11/2009 | Zhang et al. |
| 2010/0001587 | A1 | 1/2010 | Casey et al. |
| 2010/0126550 | A1 | 5/2010 | Foss |
| 2010/0269883 | A1 | 10/2010 | Sarhan |
| 2010/0288327 | A1 | 11/2010 | Lisi et al. |
| 2010/0327659 | A1 | 12/2010 | Lisi et al. |

FOREIGN PATENT DOCUMENTS

| | | |
|---|---|---|
| JP | 07-234733 A | 9/1995 |
| JP | 08-123563 A | 5/1996 |
| JP | 08-314555 A | 11/1996 |
| JP | 10014105 A | 1/1998 |
| JP | 10155240 A | 6/1998 |
| JP | 11098679 A | 4/1999 |
| JP | 2000112545 A | 4/2000 |
| JP | 2000116010 A | 4/2000 |
| JP | 2003134661 A | 5/2003 |
| JP | 2003216255 A | 7/2003 |
| JP | 2005-151662 | 6/2005 |
| JP | 2005243852 A | 9/2005 |
| JP | 2005252172 A | 9/2005 |
| JP | 2006134118 A | 5/2006 |
| JP | 2006216660 A | 8/2006 |
| JP | 2006-320149 | 11/2006 |
| JP | 2007-133765 | 5/2007 |
| KR | 100757320 B1 | 9/2007 |
| KR | 20080010116 A | 1/2008 |
| KR | 100886891 B1 | 3/2009 |
| KR | 1020090133036 A | 12/2009 |
| WO | WO 2007/084196 A2 | 7/2007 |

OTHER PUBLICATIONS

"Perspectives of Concentrating Solar Power", Renewable Energy India 2008 Expo, Aug. 22, 2008, 16 pages.

"APEC 2008, 23rd Annual Applied Power Electronics Conference and Exposition", vol. 1, Seminars 1-6, Feb. 24-28, 2008, Austin, Texas, 89 pages.

Yunwei Li, et al., "Design, Analysis, and Real-Time Testing of a Controller for Multibus Microgrid System", IEEE Transactions on Power Electronics, vol. 19, No. 5, Sep. 2004, p. 1195-1204.

R.H. Lasseter, "MicroGrids", 2002 IEEE Power Engineering Society Winter Meeting, vol. 1, Jan. 2002, p. 305-308.

John Stevens, "Development of Sources and a Testbed for CERTS Microgrid Testing", 2004 IEEE Power Engineering Society General Meeting, Jun. 2004, p. 1-2.

Mike Barnes, et al., "Real-World MicroGrids—An Overview", 2007 IEEE SoSE International Conference, Apr. 2007, p. 1-8.

Paolo Piagi, et al., "Autonomous Control of Microgrids", IEEE Power Engineering Society General Meeting, Jun. 2006, 8 pages.

Y. Zoka, et al., "An Interaction Problem of Distributed Generators Installed in a MicroGrid", 2004 IEEE International Conference on Electric Utility Deregulation, Restructuring and Power Technologies (DRPT2004), Apr. 2004, Hong Kong, p. 795-799.

M.P.F. Hommelberg, et al., "Distributed Control Concepts using Multi-Agent technology and Automatic Markets: An indispensable feature of smart power grids", 2007 IEEE Power Engineering Society General Meeting, Jun. 2007, p. 1-7.

Notification of Transmittal of the International Search Report and the Written Opinion of the International Searching Authority, or the Declaration dated Dec. 17, 2009 in connection with PCT Application No. PCT/US2009/044033.

Guo Heng, et al., "A Novel Maximum Power Point Tracking Strategy for Stand-alone Solar Pumping Systems", 2005 IEEE, 5 pages.

Debosmita Das, et al., "An Optimal Design of a Grid Connected Hybrid Wind/Photovoltaic/Fuel Cell System for Distributed Energy Production", 2005 IEEE, p. 2499-2504.

Claus Bjerge, et al., "How to run an offshore wind farm like a conventional power plant", www.modernpowersystems.com, Jan. 2007, 4 pages.

Steven Anderson, "Remote . . . But Not Economically Out of Reach", Power and Energy, Dec. 15, 1986, 5 pages.

Qihi Liu, et al., "Novel Modeling and Control of Doubly-Fed Variable-Speed Constant-Frequency Wind Power Generator", The 33rd Annual Conference of the IEEE Industrial Electronics Society (IECON), Nov. 5-8, 2007, p. 1621-1626.

Casisheng Wang, "Modeling and Control of Hybrid Wind/Photovoltaic/Fuel Cell Distributed Generation Systems", Jul. 2006, Montana State University, 403 pages.

Notification of Transmittal of the International Search Report and the Written Opinion of the International Searching Authority, or the Declaration dated Dec. 23, 2009 in connection with International Patent Application No. PCT/US2009/044036.

Jianhui Zhang, et al., "Active Cell and Module Balancing for Batteries or Other Power Supplies", U.S. Appl. No. 12/882,781, filed Sep. 15, 2010.

Ramesh Khanna, "Solar-Powered Battery Charger and Related System and Method", U.S. Appl. No. 12/589,984, filed Oct. 30, 2009.

Andrew Foss, "System and Method for Solar Panel Array Analysis", U.S. Appl. No. 12/386,958, filed Apr. 24, 2009.

Gianpaolo Lisi, et al., "Off-Grid LED Street Lighting System With Multiple Panel-Storage Matching", U.S. Appl. No. 12/925,110, filed Oct. 14, 2010.

Notification of Transmittal of the International Search Report and the Written Opinion of the International Searching Authority, or the Declaration dated Dec. 24, 2009 in connection with International Patent Application No. PCT/US2009/044019.

Carlos Meza, et al., "Boost-Buck inverter variable structure control for grid-connected photovoltaic systems", 2005 IEEE, p. 1318-1321.

Mikihiko Matsui, et al., "A New Maximum Photovoltaic Power Tracking Control Scheme Based on Power Equilibrium at DC Link", 1999 IEEE, p. 804-809.

Notification of Transmittal of the International Search Report and the Written Opinion of the International Searching Authority, or the Declaration dated Dec. 23, 2009 in connection with PCT Application No. PCT/US2009/044027.

Notification of Transmittal of the International Search Report and the Written Opinion of the International Searching Authority, or the Declaration dated Dec. 23, 2009 in connection with PCT Application No. PCT/US2009/044015.

Jianhui Zhang, et al., "Method and System for Providing Central Control in a Energy Generating System", U.S. Appl. No. 12/152,479, filed May 14, 2008.

Stephen W. Moore, et al., "A Review of Cell Equalization Methods for Lithium Ion and Lithium Polymer Battery Systems", Society of Automotive Engineers, Inc., 2001, 5 pages.

Sihua Wen, "Cell balancing buys extra run time and battery life", Analog Applications Journal, 2009, 8 pages.

(56) References Cited

OTHER PUBLICATIONS

"Five to Ten Series Cell Lithium-Ion or Lithium-Polymer Battery Protector and Analog Front End", Texas Instruments, Jun. 2008, 60 pages.

"Li-Ion, NiMH Battery Measuring, Charge Balancing and Power-supply Circuit", Atmel Corporation, Oct. 2009, 55 pages.

Werner Rößler, "Boost battery performance with active charge-balancing", EE Times-Asia, Jul. 16-31, 2008, p. 1-3.

Notification of Transmittal of the International Search Report and the Written Opinion of the International Searching Authority, or the Declaration dated Dec. 31, 2010 in connection with PCT Application No. PCT/US2010/031462.

Notification of Transmittal of the International Search Report and the Written Opinion of the International Searching Authority, or the Declaration dated Jan. 3, 2011 in connection with PCT Application No. PCT/US2010/031505.

Notification of Transmittal of the International Search Report and the Written Opinion of the International Searching Authority, or the Declaration dated Jan. 13, 2011 in connection with PCT Application No. PCT/US2010/034783.

\* cited by examiner

OPTICALLY-CONTROLLED SHUNT CIRCUIT FOR MAXIMIZING PHOTOVOLTAIC PANEL EFFICIENCY

TECHNICAL FIELD

This disclosure is generally directed to photovoltaic systems. More specifically, this disclosure is directed to an optically-controlled shunt circuit for maximizing photovoltaic panel efficiency.

BACKGROUND

Solar and wind energy provide renewable, non-polluting energy sources, as opposed to conventional non-renewable, polluting energy sources, such as coal or oil. Because of this, solar and wind energy have become increasingly important as energy sources that may be converted into electricity. For solar energy, photovoltaic panels arranged in an array typically provide the means to convert solar energy into electrical energy.

In operating a photovoltaic array, maximum power point tracking (MPPT) is generally used to automatically determine a voltage or current at which the array should operate to generate a maximum power output for a particular temperature and solar irradiance. Generally, an array includes strings of panels, with the least efficient panel in a string determining the current and efficiency for the entire string.

Shading over a panel in a string introduces resistance in the string. Thus, the shading blocks the flow of current and lowers the power output. One such blockage in the string can lower the available power significantly. Currently available MPPT techniques can observe the available optimum power for each panel and bypass the flow of current, optimizing a cost function to maximize the power flow by "removing" the high-impedance shaded panel from a string of panels. However, while removing a partially-shaded panel increases the efficiency of the string, it also results in the inability to use the energy that is generated by the cells that are not shaded in the panel.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
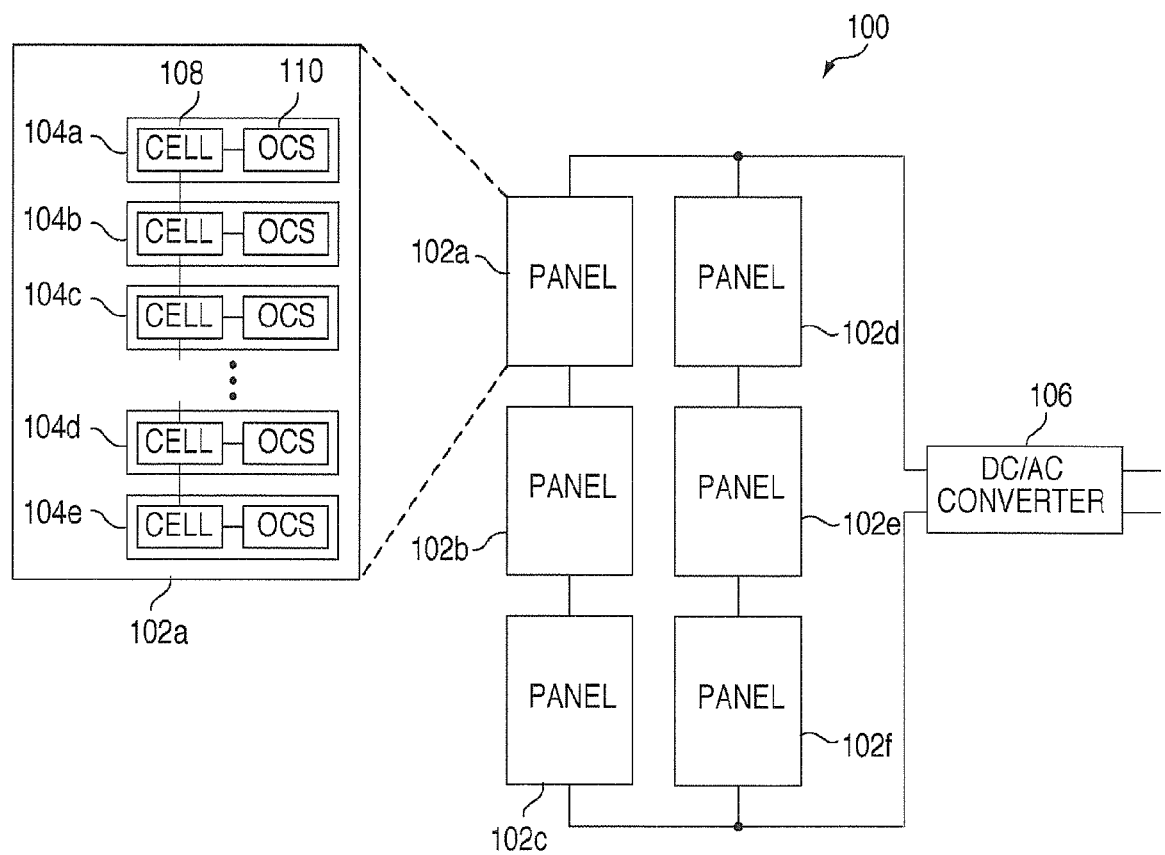
FIG. 1 illustrates an array of photovoltaic (PV) panels in accordance with one embodiment of this disclosure.

FIG. 1 illustrates an array 100 of photovoltaic (PV) panels 102 in accordance with one embodiment of this disclosure. As described in more detail below, at least one of the panels 102 comprises bypassable cells 104 that are capable of being bypassed when shaded.

The PV panels 102 in the array 100 are arranged in strings. For the illustrated embodiment, the array 100 comprises two strings, with each string comprising three panels 102. However, it will be understood that the array 100 may comprise any suitable number of strings of panels 102, and each string may comprise any suitable number of panels 102. Also for the illustrated embodiment, the panels 102 in each string are implemented in a series connection.

Each PV panel 102 is capable of converting solar energy into electrical energy. A DC-AC converter 106 may be coupled to the array 100 and is capable of converting the direct current (DC) generated by the panels 102 into an alternating current (AC) for a load (not shown in FIG. 1), which may be coupled to the DC-AC converter 106.

For some embodiments, maximum power point tracking (MPPT) may be implemented for the entire array 100 and/or for each panel 102. MPPT automatically determines a voltage or current at which the array 100 (or panel 102) should operate to generate a maximum power output for a particular temperature and solar irradiance. For example, for a particular embodiment, each of the panels 102 may be coupled to a corresponding MPPT device (not shown in FIG. 1) that is capable of providing MPPT for that panel 102.

For the illustrated embodiment, the panel 102a comprises a plurality of bypassable cells 104 arranged in a string, with each of the bypassable cells 104 comprising a PV cell 108 and a corresponding optically-controlled shunt (OCS) circuit 110. It will be understood that each of the panels 102a-f may comprise bypassable cells 104. In addition, for an alternative embodiment, any one or more of the panels 102b-f may comprise PV cells 108 without corresponding OCS circuits 110 instead of bypassable cells 104. Also, any of the panels 102a-f may comprise a combination of bypassable cells 104 and PV cells 108.

Each of the PV cells 108 is capable of generating electrical energy based on solar energy. Each OCS circuit 110 is capable of sampling the solar energy received at the corresponding PV cell 108 and bypassing that PV cell 108 when the sample indicates that the PV cell 108 is shaded and, therefore, incapable of generating electrical energy in the current lighting conditions.

As described in more detail below, for some embodiments, each OCS circuit 110 may provide a non-variable bypass for its corresponding PV cell 108. For these embodiments, the OCS circuit 110 may be activated when insufficient light exists, thereby bypassing the PV cell 108, or deactivated when sufficient light exists, thereby not bypassing the PV cell 108. For this case, sufficient light is light that provides enough energy for the PV cell 108 to operate, while insufficient light is light that fails to provide enough energy for the PV cell 108 to operate.

For other embodiments, each OCS circuit 110 may provide a variable bypass for its corresponding PV cell 108. For these embodiments, the OCS circuit 110 may be (i) fully activated when insufficient light exists, thereby completely bypassing the PV cell 108, (ii) partially activated when adequate light exists, thereby partially bypassing the PV cell 108, or (iii)

deactivated when full light exists, thereby not bypassing the PV cell 108. For this case, full light is light that provides enough energy for the PV cell 108 to operate at substantially full capacity. Adequate light is light that provides enough energy for the PV cell 108 to operate, though not enough to operate at full capacity. Insufficient light is light that fails to provide enough energy for the PV cell 108 to operate.

As used herein, "completely bypassed" and "bypassed" mean substantially bypassed, "not bypassed" means substantially not bypassed, and "partially bypassed" means less than substantially bypassed and more than substantially not bypassed.

Figure 2:
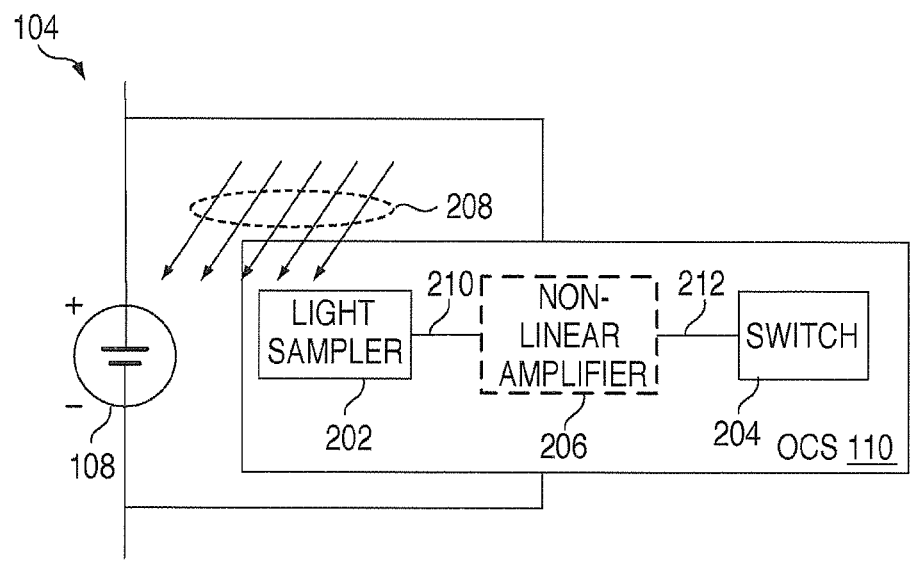
FIG. 2 illustrates one of the bypassable cells of FIG. 1 in accordance with one embodiment of this disclosure.

FIG. 2 illustrates a bypassable cell 104 in accordance with one embodiment of this disclosure. For this embodiment, the OCS circuit 110 comprises a light sampler 202 coupled to a switch 204. The light sampler 202 may comprise a photodiode or other suitable light-sensitive component. The switch 204 may comprise a PMOS transistor, an NMOS transistor or any other suitable component capable of being operated as a switch. The light sampler 202 is capable of turning the switch 204 off or on (or partially on, depending on the particular embodiment). As described in more detail below, the OCS circuit 110 may also comprise an optional non-linear amplifier 206 coupled to the light sampler 202 and the switch 204. For some embodiments, the OCS circuit 110 may be implemented in the form of a chip that is surface mounted across the terminals of the PV cell 108.

The light sampler 202, which is in relatively close proximity to the PV cell 108, is capable of sampling the light 208 available at the PV cell 108 and generating an activation signal 210 based on the available light 208. The switch 204 is capable of receiving a switch signal 212 based on the activation signal 210 and may be capable either of switching on or off or of switching on, partially on, or off based on the switch signal 212. For embodiments omitting the non-linear amplifier 206, the activation signal 210 may be the same as the switch signal 212.

When the switch 204 is turned off, the OCS circuit 110 is deactivated and the PV cell 108 is not bypassed. When the switch 204 is turned on, the OCS circuit 110 is activated and the PV cell 108 is bypassed. For some embodiments, the OCS circuit 110 may be either activated or deactivated. For other embodiments, the OCS circuit 110 may be fully activated, partially activated or deactivated. For these embodiments, the light sampler 202 is capable of partially turning on the switch 204 in order to partially activate the OCS circuit 110, thereby partially bypassing the PV cell 108. In this case, the activation signal 210 may be capable of indicating the amount of light 208 available at the PV cell 108.

For some embodiments, the relationship between the maximum power output from the array 100 and the output of a PV cell 108 is non-linear. Thus, for these embodiments, it may be desirable to accommodate this non-linearity via the signal 212 applied to the switch 204. For embodiments in which the PV cell 108 may be partially bypassed, therefore, the OCS circuit 110 may comprise an optional non-linear amplifier 206 coupled between the light sampler 202 and the switch 204.

For these embodiments, the non-linear amplifier 206 is capable of receiving the activation signal 210 generated by the light sampler 202 that indicates the amount of light 208 available at the PV cell 108. Based upon the amount of available light 208 relative to full light and no light, the non-linear amplifier 206 is capable of non-linearly amplifying the activation signal 210 to generate the switch signal 212 for the switch 204. The gain curve of the non-linear amplifier 206 may be optimized such that the power output for the array 100 is maximized.

Figure 3:
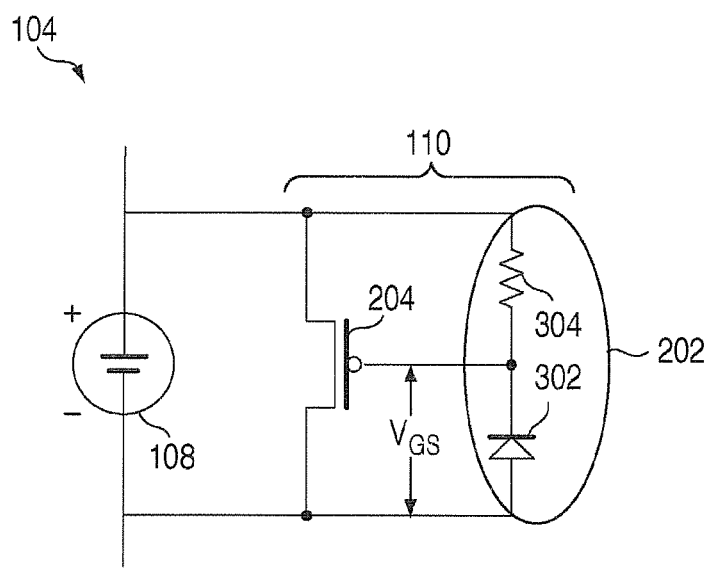
FIG. 3 illustrates details of the bypassable cell of FIG. 2 in accordance with one embodiment of this disclosure.

FIG. 3 illustrates details of a bypassable cell 104 in accordance with one embodiment of this disclosure. For this particular embodiment, the light sampler 202 comprises a photodiode 302 and a biasing resistor 304, and the switch 204 comprises a PMOS transistor (the optional non-linear amplifier 206 is not shown in FIG. 3). The PMOS transistor 204 is capable of conducting the maximum string current for a string of PV cells 108.

When insufficient light 208 is available for the entire panel 102 that comprises the illustrated PV cell 108, such as at night or when that panel 102 is completely shaded, no photo current is generated by the panel 102. Thus, no current is flowing and no power is being generated.

However, when light 208 is available for at least a portion of the panel 102, including for the illustrated PV cell 108, the photodiode 302 essentially samples the light 208 at the PV cell 108 by being exposed to that light 208, which results in the photodiode 302 being turned on. In this case, the gate-to-source voltage ($V_{GS}$) of the PMOS transistor 204 is held low by the conducting photodiode 302. The PMOS transistor 204 is thus held in an off state, which deactivates the OCS circuit 110, allowing the PV cell 108 to generate power in a normal manner.

When light 208 is available for at least a portion of the panel 102, but is not available for the illustrated PV cell 108, the photodiode 302 samples that unavailable light 208 at the PV cell 108, which results in the photodiode 302 being turned off. In this case, the gate-to-source voltage ($V_{GS}$) of the PMOS transistor 204, which is biased by the voltage divider defined by the photodiode 302 and the biasing resistor 304, increases. Thus, the PMOS transistor 204 is in an on state, which either partially or fully activates the OCS circuit 110 depending on the particular embodiment, and the PV cell 108 is at least partially bypassed.

Figure 4:
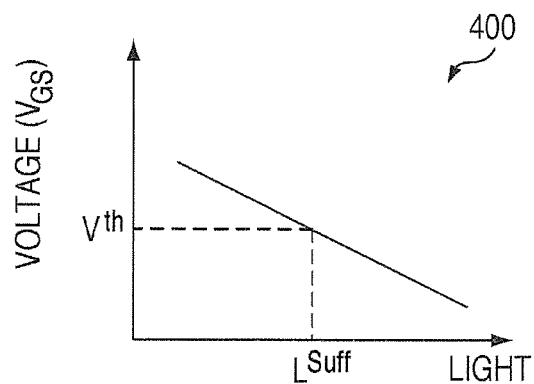
FIG. 4 illustrates an example of voltage variation with light for the optically-controlled shunt (OCS) circuit of FIG. 3 in accordance with one embodiment of this disclosure.

FIG. 4 is a graph 400 illustrating an example of voltage variation with light for the optically-controlled shunt (OCS) circuit 110 of FIG. 3 in accordance with one embodiment of this disclosure. For this embodiment, a non-variable bypass is provided for the PV cell 108 by the OCS circuit 110. Thus, the OCS circuit 110 is either fully activated or deactivated.

When light 208 is fully available for the PV cell 108, the gate-to-source voltage ($V_{GS}$) of the PMOS transistor 204 is low, and the PMOS transistor 204 is off. In this case, the OCS circuit 110 is deactivated and the PV cell 108 is not bypassed. However, as the light 208 decreases, the impedance of the photodiode 302 increases and $V_{GS}$ begins to rise.

For the illustrated embodiment, the PMOS transistor 204 may be substantially off when the light 208 is above a sufficient light threshold ($L_{Suff}$) that corresponds to a voltage threshold ($V_{th}$) for $V_{GS}$ of the PMOS transistor 204. When the light 208 drops below $L_{Suff}$, raising $V_{GS}$ above $V_{th}$, the PMOS transistor 204 may be substantially on. In this case, the OCS circuit 110 is activated and the PV cell 108 is bypassed.

Figure 5:
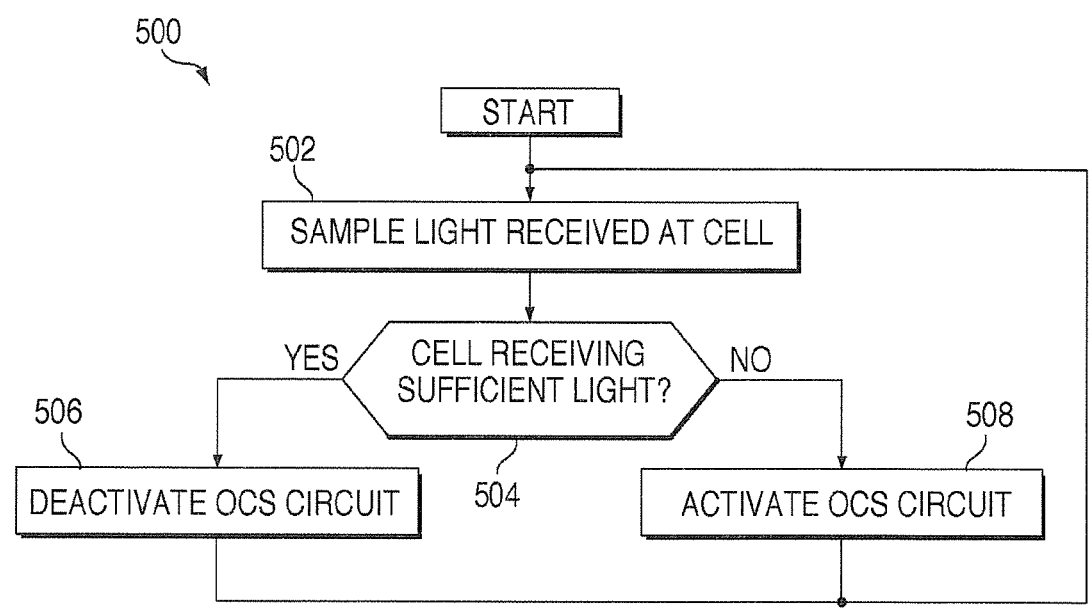
FIG. 5 illustrates a method for bypassing a cell in a PV panel using the OCS circuit of FIG. 2 in accordance with one embodiment of this disclosure.

FIG. 5 illustrates a method 500 for bypassing a cell 108 in a PV panel 102 using the OCS circuit 110 in accordance with one embodiment of this disclosure. Initially, the light sampler 202 samples the light 208 received at the PV cell 108 (step 502). For example, the photodiode 302 may be exposed to the light 208 available at the PV cell 108.

If the PV cell 108 is receiving sufficient light 208 for operation (step 504), the light sampler 202 deactivates the OCS circuit 110 by turning off the switch 204 (step 506). For example, the photodiode 302 may be turned on by the available light 208, causing the gate-to-source voltage of the PMOS transistor 204 to be held low. This turns off the PMOS transistor 204, deactivating the OCS circuit 110. As a result, the PV cell 108 may function normally.

However, if the PV cell 108 is receiving insufficient light 208 for operation (step 504), the light sampler 202 activates the OCS circuit 110 by turning on the switch 204 (step 508). For example, the photodiode 302 may be turned off by the lack of available light 208, causing the gate-to-source voltage of the PMOS transistor 204 to increase. This turns on the PMOS transistor 204, activating the OCS circuit 110. As a result, the PV cell 108 is bypassed.

The light sampler 202 continues to sample the light 208 at the PV cell 108 (step 502) in order to make adjustments to the OCS circuit 110 based on changing light 208 conditions. In this way, a non-variable bypass of the PV cell 108 may be provided. As a result, when shaded, the PV cell 108 does not represent a blockage to the overall flow of power, resulting in the power delivery of the panel 102 being maximized.

Figure 6:
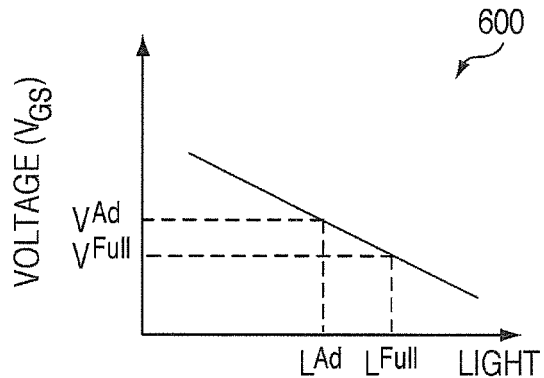
FIG. 6 illustrates an example of voltage variation with light for the optically-controlled shunt (OCS) circuit of FIG. 3 in accordance with another embodiment of this disclosure.

FIG. 6 is a graph 600 illustrating an example of voltage variation with light for the optically-controlled shunt (OCS) circuit 110 of FIG. 3 in accordance with another embodiment of this disclosure. For this embodiment, a variable bypass is provided for the PV cell 108 by the OCS circuit 110, i.e., as the light 208 decreases or increases, the PMOS transistor 204 may be gradually switched between an off state, a variable partially on state, and a fully on state. Thus, the OCS circuit 110 is either deactivated, partially activated or fully activated.

When full light ($L_{Full}$ or more) is available for the PV cell 108, the gate-to-source voltage ($V_{GS}$) of the PMOS transistor 204 is low ($V_{Full}$ or lower), and the PMOS transistor 204 is turned off. In this case, the OCS circuit 110 is deactivated, and the PV cell 108 is not bypassed.

However, as the light 208 decreases, the impedance of the photodiode 302 increases and $V_{GS}$ begins to rise. When the light 208 drops below full light but remains higher than adequate light ($L_{Ad}$), $V_{GS}$ increases to more than $V_{Full}$ and less than $V_{Ad}$. In this case, the PMOS transistor 204 is partially turned on, which partially activates the OCS circuit 110 such that the PV cell 108 is partially bypassed. The amount that the PMOS transistor 204 is partially turned on is a function of the available light 208. For example, the PMOS transistor 204 is mostly turned off when the light 208 is near $L_{Full}$ and mostly turned on when the light 208 is near $L_{Ad}$. For some embodiments, the optional non-linear amplifier 206 may be used to provide a non-linear reaction in the PMOS transistor 204 to the decreasing or increasing available light 208.

As the light 208 continues to decrease, the impedance of the photodiode 302 continues to increase and $V_{GS}$ continues to rise. When the light 208 drops below $L_{Ad}$, $V_{GS}$ increases above $V_{Ad}$ and the PMOS transistor 204 is turned on. In this case, the OCS circuit 110 is fully activated, and the PV cell 108 is completely bypassed.

Similarly, as the available light 208 increases, the PV cell 108 may change from being completely bypassed to partially bypassed when the light 208 increases above $L_{Ad}$ and from being partially bypassed to not bypassed when the light 208 increases above $L_{Full}$.

Figure 7:
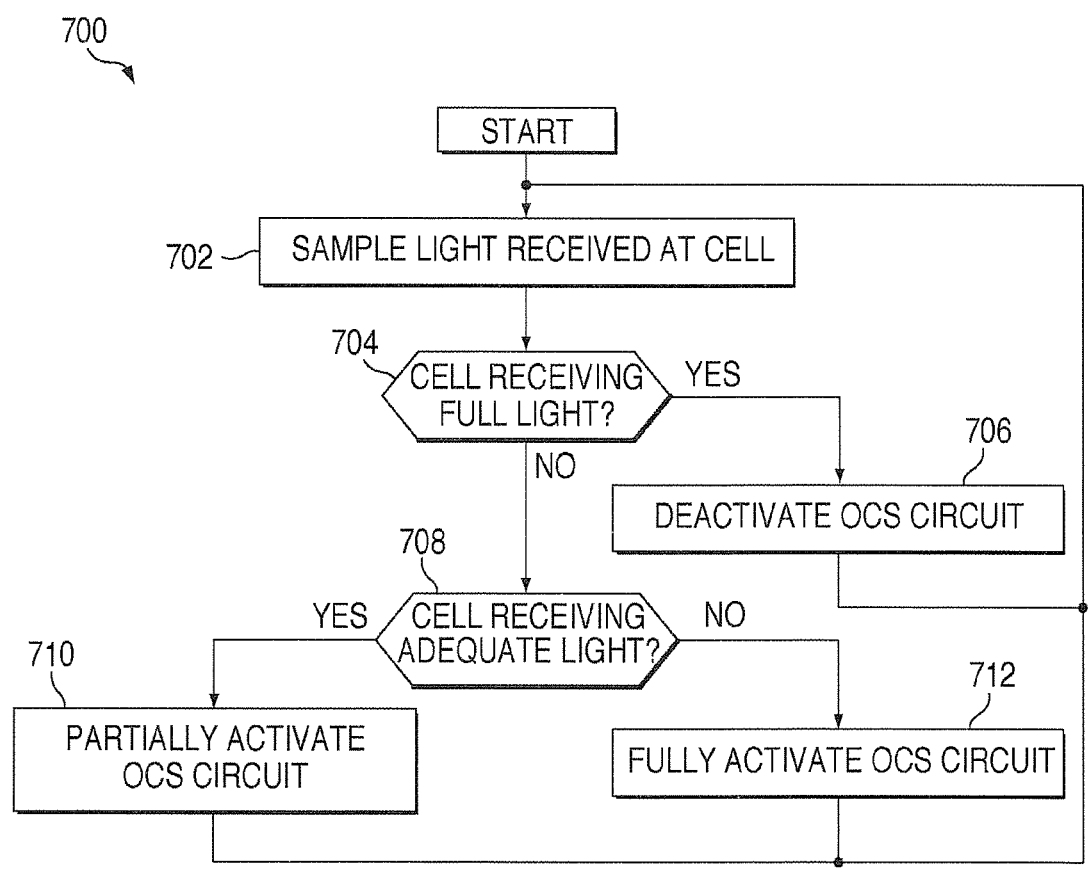
FIG. 7 illustrates a method for bypassing a cell in a PV panel using the OCS circuit of FIG. 2 in accordance with another embodiment of this disclosure.

FIG. 7 illustrates a method 700 for bypassing a cell 108 in a PV panel 102 using the OCS circuit 110 in accordance with another embodiment of this disclosure. Initially, the light sampler 202 samples the light 208 received at the PV cell 108 (step 702). For example, the photodiode 302 may be exposed to the light 208 available at the PV cell 108.

If the PV cell 108 is receiving full light (step 704), the light sampler 202 deactivates the OCS circuit 110 by turning off the switch 204 (step 706). For example, the photodiode 302 may be turned on by the available light 208, causing the gate-to-source voltage of the PMOS transistor 204 to be held low. This turns off the PMOS transistor 204, deactivating the OCS circuit 110. As a result, the PV cell 108 may function normally.

If the PV cell 108 is not receiving full light (step 704) but is receiving adequate light for operation (step 708), the light sampler 202 partially activates the OCS circuit 110 by partially turning on the switch 204 (step 710). For example, the photodiode 302 may be partially turned on by the available light 208, causing the gate-to-source voltage of the PMOS transistor 204 to partially increase. This partially turns on the PMOS transistor 204, which partially activates the OCS circuit 110. As a result, the PV cell 108 may be partially bypassed.

For some embodiments, this partial activation of the PMOS transistor 204 may be provided based solely on the partial activation of the photodiode 302. For other embodiments, the optional non-linear amplifier 206 may non-linearly amplify the activation signal 210 from the partially turned-on photodiode 302 to generate the switch signal 212 for the PMOS transistor 204.

If the PV cell 108 is receiving insufficient light for operation (step 708), the light sampler 202 fully activates the OCS circuit 110 by fully turning on the switch 204 (step 712). For example, the photodiode 302 may be turned off by the lack of available light 208, causing the gate-to-source voltage of the PMOS transistor 204 to increase. This fully turns on the PMOS transistor 204, fully activating the OCS circuit 110. As a result, the PV cell 108 is completely bypassed.

The light sampler 202 continues to sample the light 208 at the PV cell 108 (step 702) in order to make adjustments to the OCS circuit 110 based on changing light 208 conditions. In this way, a variable bypass of the PV cell 108 may be provided. As a result, when shaded, the PV cell 108 does not represent a blockage to the overall flow of power, resulting in the power delivery of the panel 102 being maximized.

Although FIGS. 5 and 7 illustrate examples of methods 500 and 700 for bypassing a cell 108 in a PV panel 102, various changes may be made to these methods 500 and/or 700. For example, while the methods 500 and 700 were partially described with reference to the OCS circuit 110 of FIG. 3, the methods 500 and/or 700 may be implemented using any other suitable implementations of the OCS circuit 110. Also, while shown as a series of steps, the steps in the methods 500 and/or 700 may overlap, occur in parallel, occur multiple times, or occur in a different order.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An optically-controlled shunt (OCS) circuit for a photovoltaic cell, comprising:
   a switch; and
   a light sampler coupled to the switch, the light sampler configured to sample light at the photovoltaic (PV) cell and to turn on the switch when the sampled light comprises insufficient light for the PV cell, to partially turn on the switch when the sampled light comprises adequate light for the PV cell, and to turn off the switch when the sampled light comprises full light for the PV cell.

2. The OCS circuit of claim 1, wherein the switch comprises a transistor.

3. The OCS circuit of claim 1, wherein the light sampler comprises a photodiode.

4. The OCS circuit of claim 1, further comprising a non-linear amplifier coupled between the light sampler and the switch;
   wherein the light sampler is configured to generate an activation signal based on the sampled light;
   wherein the non-linear amplifier is configured to non-linearly amplify the activation signal to generate a switch signal; and
   wherein the switch is configured to be partially turned on based on the switch signal.

5. The OCS circuit of claim 1, wherein:
   the switch comprises a PMOS transistor;
   the light sampler comprises a photodiode and a biasing resistor;
   a first node of the PV cell is coupled to a drain of the PMOS transistor and to a first node of the biasing resistor;
   a second node of the PV cell is coupled to a source of the PMOS transistor and to a first node of the photodiode; and
   a gate of the PMOS transistor is coupled to a second node of the biasing resistor and a second node of the photodiode.

6. A bypassable photovoltaic cell, comprising:
   a photovoltaic (PV) cell; and
   an optically-controlled shunt (OCS) circuit coupled to the PV cell, the OCS circuit including
      a switch;
      a light sampler coupled to the switch;
      the OCS circuit configured to turn on the switch to bypass the PV cell when insufficient light is available for the PV cell, to partially turn on the switch when the sampled light comprises adequate light for the PV cell, and to turn off the switch when the sampled light comprises full light for the PV cell.

7. The bypassable cell of claim 6, wherein the switch comprises a transistor.

8. The bypassable cell of claim 6, wherein the light sampler comprises a photodiode.

9. The bypassable cell of claim 6, wherein:
   the OCS circuit further comprises a non-linear amplifier coupled between the light sampler and the switch;
   the light sampler is configured to generate an activation signal based on the sampled light;
   the non-linear amplifier is configured to non-linearly amplify the activation signal to generate a switch signal; and
   the switch is configured to be partially turned on based on the switch signal.

10. The bypassable cell of claim 6, wherein:
    the switch comprises a PMOS transistor;
    the light sampler comprises a photodiode and a biasing resistor;
    a first node of the PV cell is coupled to a drain of the PMOS transistor and to a first node of the biasing resistor;
    a second node of the PV cell is coupled to a source of the PMOS transistor and to a first node of the photodiode; and
    a gate of the PMOS transistor is coupled to a second node of the biasing resistor and a second node of the photodiode.

11. A method for bypassing a photovoltaic (PV) cell, comprising:
    sampling light corresponding to the PV cell; and
    bypassing the PV cell using an optically controlled shunt (OCS) circuit, including
       activating the OCS circuit when the sampled light comprises insufficient light for the PV cell to bypass the PV cell;
       partially activating the OCS circuit when the sampled light comprises adequate light for the PV cell; and
       deactivating the OCS circuit when the sampled light comprises full light for the PV cell.

12. The method of claim 11, wherein partially activating the OCS circuit comprises:
    generating an activation signal based on the sampled light;
    non-linearly amplifying the activation signal to generate a switch signal; and
    partially bypassing the PV cell based on the switch signal.

* * * * *